United States Patent
Ziegner et al.

[11] Patent Number: 6,064,286
[45] Date of Patent: May 16, 2000

[54] MILLIMETER WAVE MODULE WITH AN INTERCONNECT FROM AN INTERIOR CAVITY

[75] Inventors: Bernhard Alphonso Ziegner, Westford, Mass.; Robert John Sletten, Bow, N.H.; Nitin Jain, Nashua, N.H.; Steve Robert Brown, Derry, N.H.

[73] Assignee: The Whitaker Corporation, Wilmington, Del.

[21] Appl. No.: 09/126,616

[22] Filed: Jul. 31, 1998

[51] Int. Cl.⁷ .................................................. H01P 5/00
[52] U.S. Cl. ..................... 333/247; 333/219.1; 257/728; 361/760
[58] Field of Search ................... 333/246, 247, 333/219.1, 202; 439/67, 493; 257/704, 728, 699, 700; 174/260; 361/760, 768, 769

[56] References Cited

U.S. PATENT DOCUMENTS

| | | | |
|---|---|---|---|
| 3,629,787 | 12/1971 | Wilson | 439/67 |
| 3,729,820 | 5/1973 | Ihochi et al. | 29/627 |
| 4,530,002 | 7/1985 | Kanai | 257/697 |
| 4,631,820 | 12/1986 | Harada et al. | 439/67 X |
| 5,208,188 | 5/1993 | Newman | 437/220 |
| 5,223,739 | 6/1993 | Katsumata et al. | 257/676 |
| 5,235,300 | 8/1993 | Chan et al. | 333/247 |
| 5,266,746 | 11/1993 | Nishihara et al. | 174/254 |
| 5,294,897 | 3/1994 | Notani et al. | 333/33 |
| 5,343,074 | 8/1994 | Higgins, III et al. | 257/668 |
| 5,363,075 | 11/1994 | Fanucchi | 333/260 X |
| 5,378,657 | 1/1995 | Lin | 437/217 |
| 5,409,865 | 4/1995 | Karnezos | 437/210 |
| 5,420,460 | 5/1995 | Massangill | 257/693 |
| 5,426,319 | 6/1995 | Notani | 257/275 |
| 5,455,453 | 10/1995 | Harada et al. | 257/675 |
| 5,482,898 | 1/1996 | Marrs | 437/216 |
| 5,556,807 | 9/1996 | Bhattacharyya et al. | 437/209 |
| 5,752,851 | 5/1998 | Zaderej et al. | 439/67 X |
| 5,770,300 | 6/1998 | Okamoto et al. | 174/260 X |
| 5,821,615 | 10/1998 | Lee | 257/796 |
| 5,847,453 | 12/1998 | Uematsu et al. | 333/247 X |

FOREIGN PATENT DOCUMENTS

| | | | |
|---|---|---|---|
| 3-212006 | 9/1991 | Japan | 333/246 |

OTHER PUBLICATIONS

Advnced packaging: by Bernie Ziegner; May/Jun. 1996; Life Over 30 GHZ–Ploymer–Based packages Revolutionized RF/MW Designs; pp. 46–48.

Microelectronics packaging Handbook; 1989 by Van Nostrand Reinhold; Chapter 6, Chip–To–Package interconnections, Nicholas G. Koopman, Timothy C. Reiley, Paul A. Totta.

ISHM '95 Proceedings; A New Leadframless IC Carrier package Using Metal Base Substrate; Abastract, pp. 348–353, 1995.

*Primary Examiner*—Justin P. Bettendorf

[57] ABSTRACT

A packaged integrated circuit (20, 20a, 20b) which includes at least one waveguide port (44, 44a, 44b) and at least one interconnect (26, 26a, 26b) which is electrically connected to an integrated circuit (30, 30a, 30b).

19 Claims, 11 Drawing Sheets

6,064,286

MILLIMETER WAVE MODULE WITH AN INTERCONNECT FROM AN INTERIOR CAVITY

The present invention relates generally to packaged integrated circuits, and more specifically relates to a packaged integrated circuit which includes one or more waveguide ports.

BACKGROUND OF THE INVENTION

One known integrated circuit package has a layered lead structure comprising a transmission layer, an insulating layer, and a base layer. The base layer is a relatively thick layer of copper. The insulating layer is a polyimide dielectric layer laminated onto the base layer. The transmission layer consists of multiple copper foil conductive traces that have been patterned onto the insulating layer. Such a laminated structure is commercially available from Mitsui Toatsu Chemicals Inc. under the trademark KOOL-BASE®.

The layered lead structure is press formed to have radiused ends on a perimeter thereof. The lead structure retains its shape due to the strength and memory of the copper base layer. The press form results in an indentation at a center of the lead structure. An IC is attached to the center and wirebonded to the conductive traces of the transmission layer. The indentation is then filled with molding compound to complete the package. This style of package is termed an integrated leadless chip carrier (ILCC), and the package may be attached to a printed wiring board by engaging the radiused portion of the lead structure along a line tangent to the radius with a surface of the printed wiring board. This attachment to a printed wiring board may be made by using conventional surface mount solder manufacturing techniques.

The above-described ILCC package is not, however, appropriate for millimeter wave integrated circuits due to the frequency limitations of the use of molded packaging and surface mount attachment in a printed wiring board assembly. Additionally, the ILCC exhibits inadequate heat removal capability and it does not provide a complimentary coefficient of temperature expansion (CTE) to the millimeter wave circuit packaged therein.

OBJECTS AND SUMMARY

Accordingly, it is a general object of the present invention to provide a packaged millimeter wave integrated circuit which is capable of efficient heat dissipation, capable of providing a complimenting CTE to the packaged millimeter wave circuit, and to provide at least one waveguide port for the efficient transfer of RF energy.

Another object of the present invention is to provide a package enclosing a millimeter wave circuit therein where the millimeter wave circuit may consist of a dielectric substrate, metallization circuitry and semiconductor components.

Still another object of the present invention is to provide a packaged integrated circuit which can be mounted with respect to a printed wiring board and support plate such that waveguide ports extend through a plate supporting the printed wiring board thus providing an RF port on the other side of the support plate.

Briefly, and in accordance with the above, the present invention provides a packaged integrated circuit which includes at least one waveguide port and at least one interconnect which is electrically connected to an integrated circuit packaged therein. Preferably, it is a millimeter wave integrated circuit which is packaged therein.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION OF EMBODIMENTS OF THE INVENTION

Figure 1:
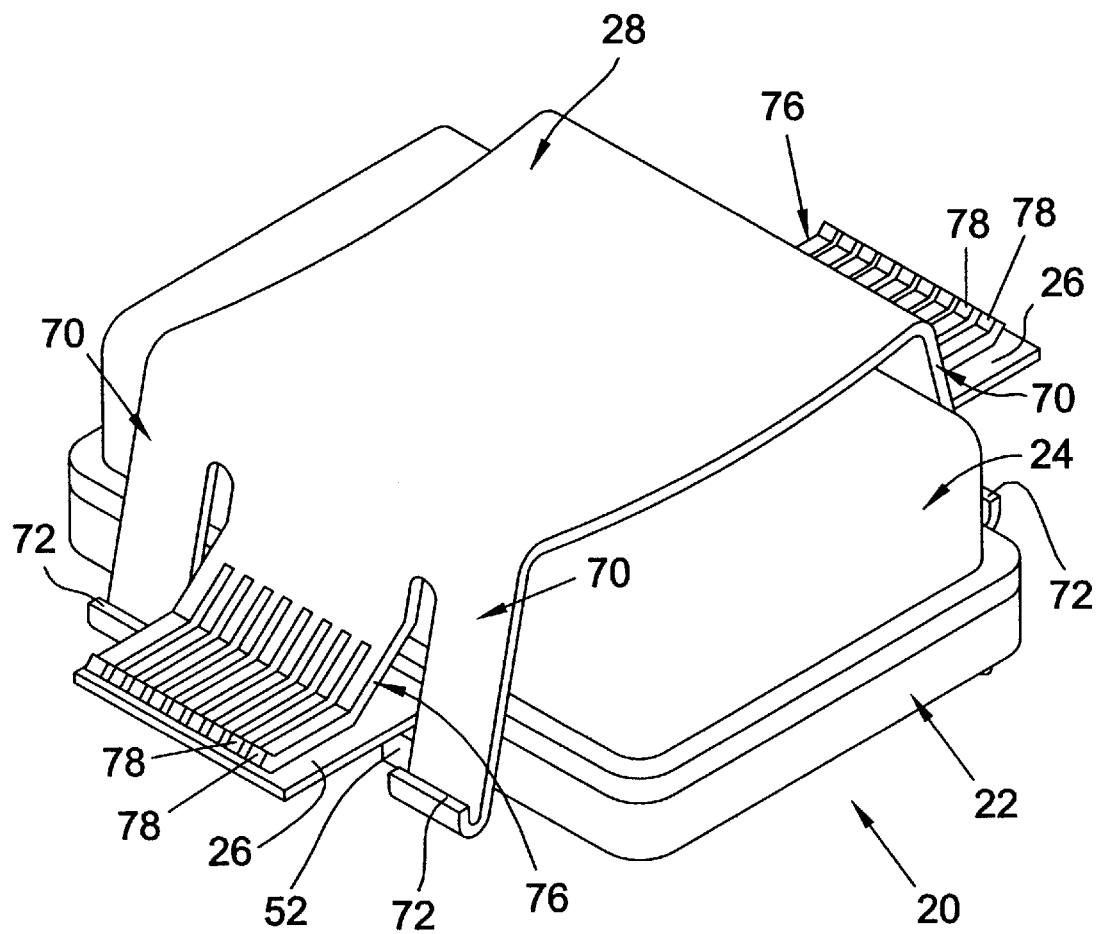
FIG. 1 is a perspective view of a packaged integrated circuit in accordance with a preferred embodiment of the present invention.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

Figure 8:
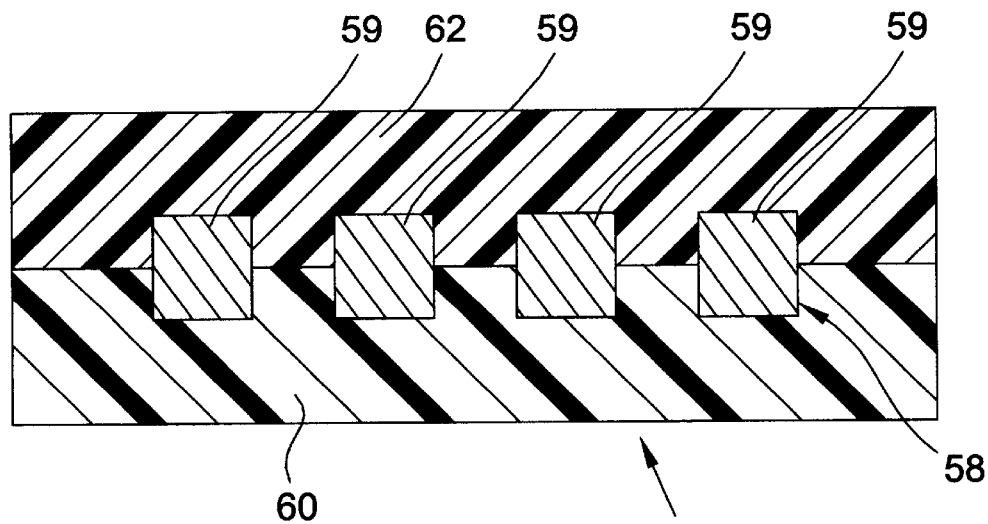
FIG. 8 is a cross-sectional view, taken along line 8—8 of FIG. 5, of an interconnect component of the packaged integrated circuit illustrated in FIG. 1.
Figure 9:
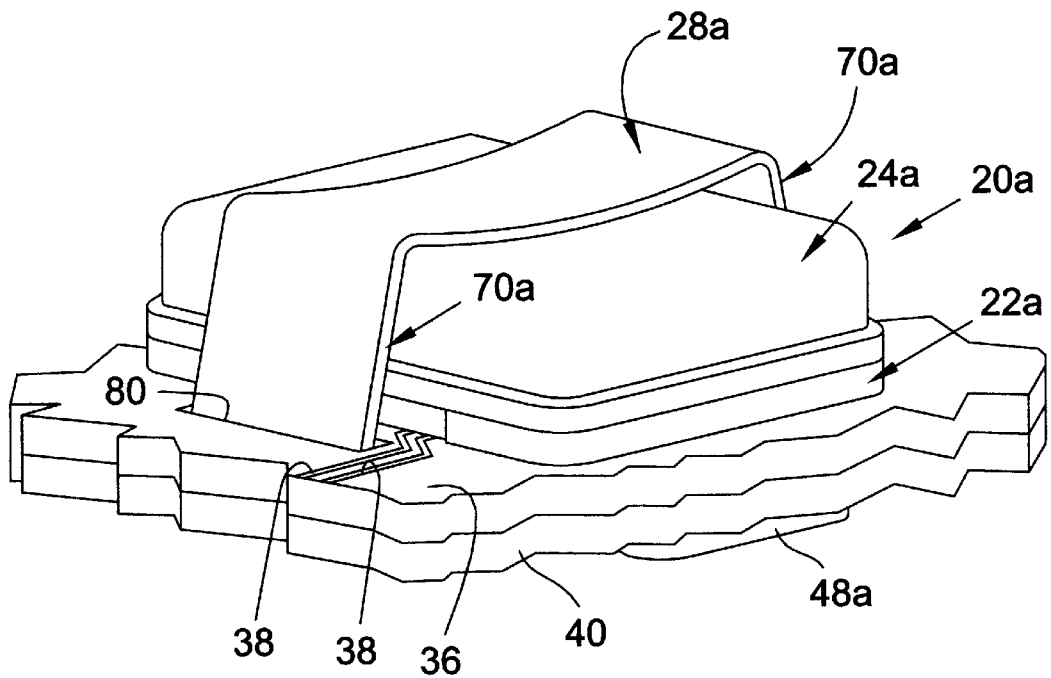
FIG. 9 is a perspective view of a packaged integrated circuit in accordance with an alternative embodiment of the present invention, showing the packaged integrated circuit mounted.
Figure 13:
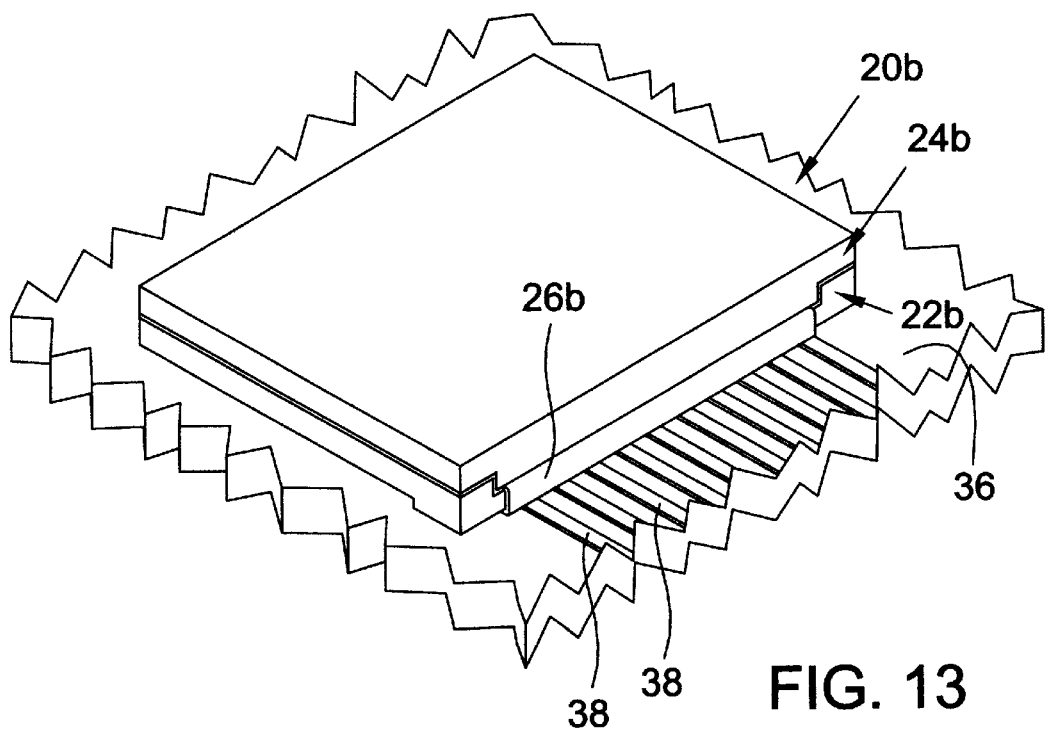
FIG. 13 is a perspective view of a packaged integrated circuit in accordance with an alternative embodiment of the present invention, showing the packaged integrated circuit mounted.

FIG. 1 illustrates a packaged integrated circuit 20 which is in accordance with a preferred embodiment of the present invention, and FIGS. 9 and 13 illustrate packaged integrated circuits 20a, 20b which are in accordance with alternative embodiments of the present invention. Each of the packaged integrated circuits 20, 20a, 20b will be hereinafter sometimes referred to as a "package". The package 20 which is illustrated in FIG. 1 and which is in accordance with a preferred embodiment of the present invention will now be described. FIGS. 1–9 relate to package 20.

Figure 2:
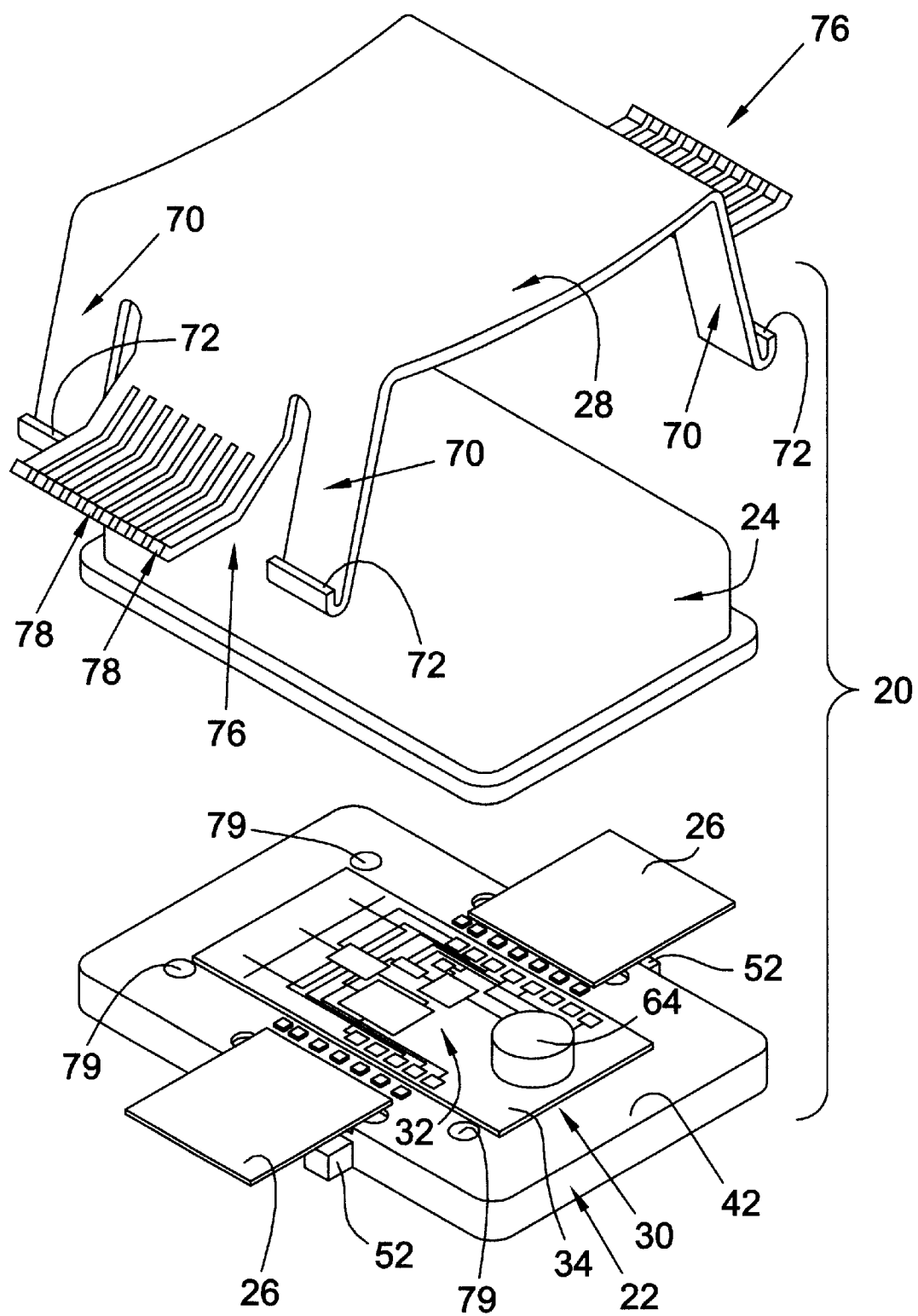
FIG. 2 is an exploded perspective view of the packaged integrated circuit illustrated in FIG. 1.
Figure 3:
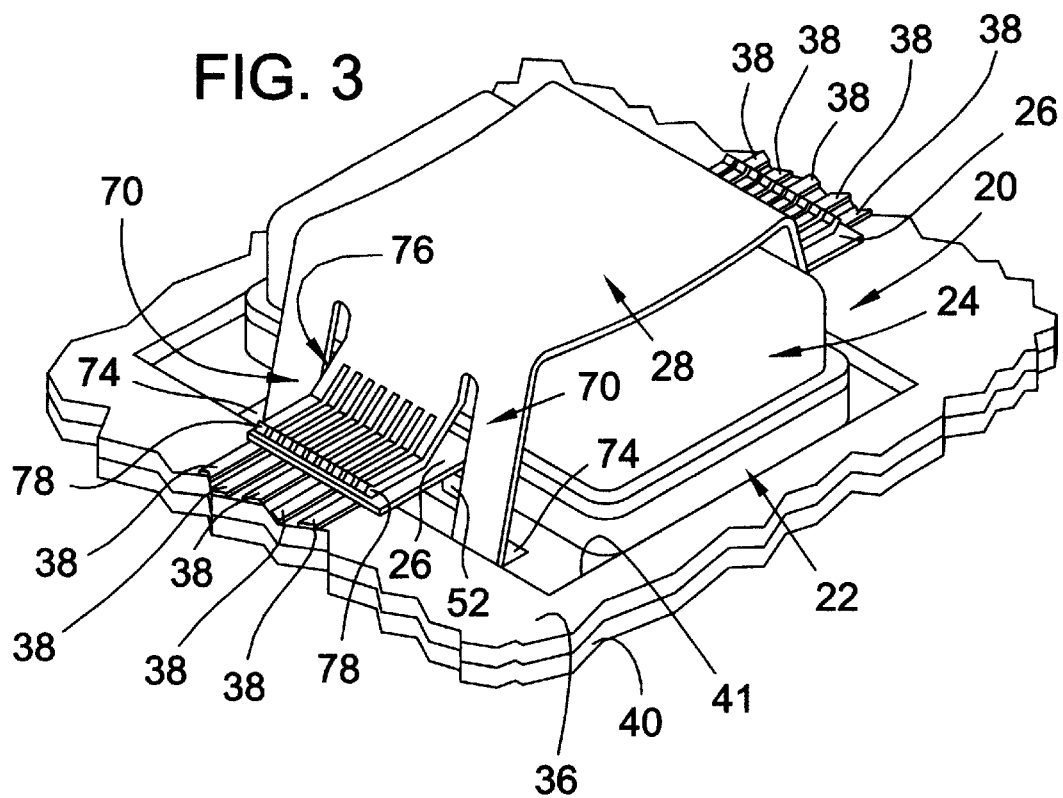
FIG. 3 is a perspective view of the packaged integrated circuit illustrated in FIG. 1, showing the packaged integrated circuit mounted on a printed wiring board.
Figure 5:
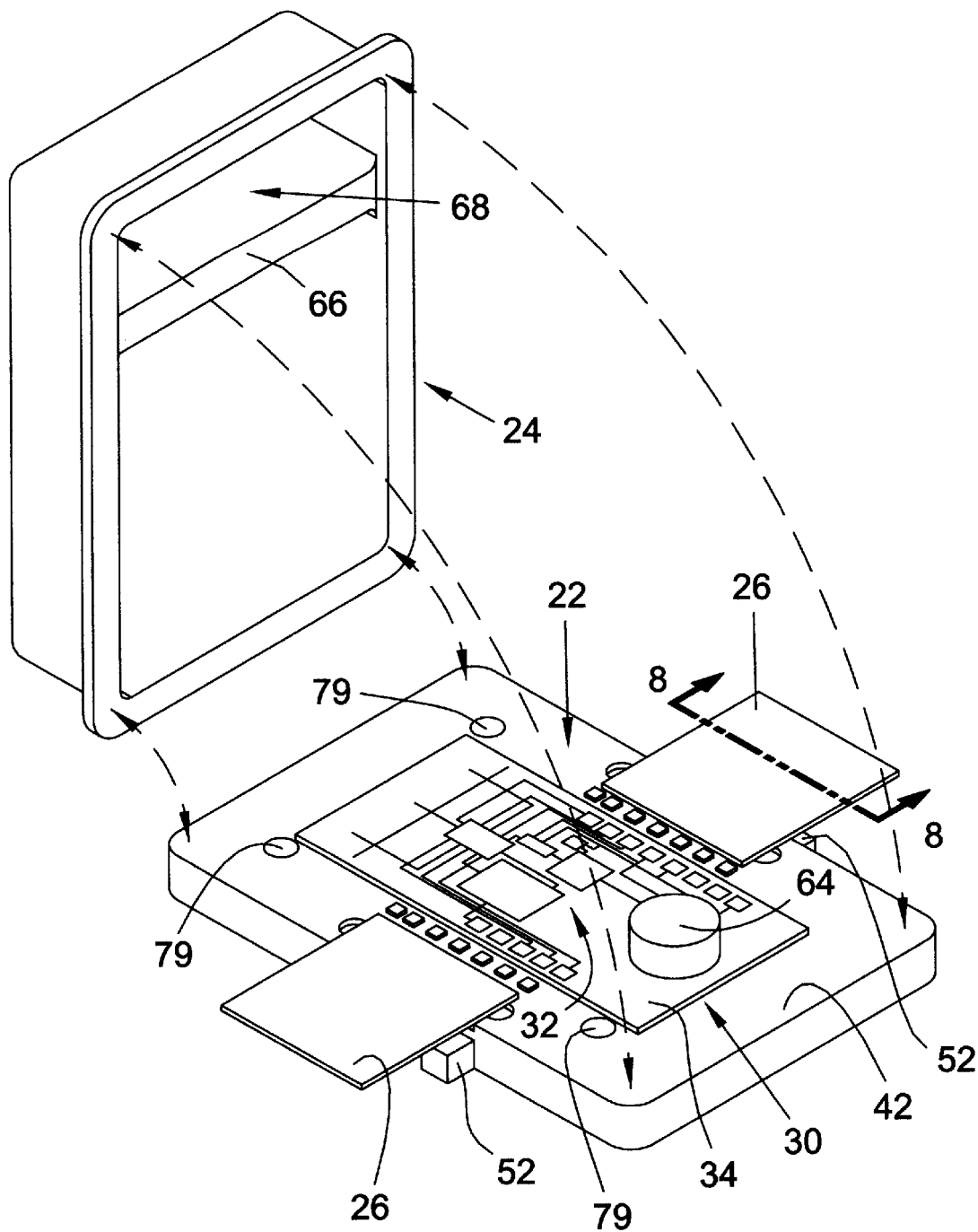
FIG. 5 is a perspective view of the packaged integrated circuit illustrated in FIG. 1, showing a spring clip removed and a cover flipped from a base thereby exposing internal components of the packaged integrated circuit.

As shown in FIGS. 1–3, the package 20 which is in accordance with a preferred embodiment of the present invention includes a base 22, a cover 24, a pair of interconnects 26, and a spring clip 28. When the base 22 and the cover 24 are engaged with each other, as illustrated in FIGS. 1 and 3, they form a housing, and within the housing is an integrated circuit 30, as shown in FIGS. 2 and 5, such as a millimeter wave circuit 32 mounted on a glass substrate 34. Specifically, the integrated circuit 30 is mounted on the base 22, within the housing formed by the base 22 and the cover 24. Therefore, the package 20 can be said to consist of a base 22, an integrated circuit 30, a pair of interconnects 26, a cover 24 and a spring clip 28.

As shown in FIG. 3, the package 20 is mountable on a substrate, such as on an printed wiring board 36, or a printed circuit board, having conductive traces 38 thereon. For example, the package 20 may be mountable on an FR4 printed wiring board. The package 20 may be mounted onto the surface of the printed wiring board 36, or, as shown, the package 20 may be mounted directly to a metal plate 40 supporting the printed wiring board 36 by having the printed wiring board 36 relieved in the affected area 41. In both cases, the package 20 preferably becomes mounted with respect to the printed wiring board 36 such that the integrated circuit 30 in the package 20 becomes electrically connected to conductive traces 38 on the printed wiring board 36 via the interconnects 26 on the package base 22. This mounting and resulting electrical connection will be described more fully later herein.

Preferably, the base component 22 of the package is made of a sintered copper-molybdenum (CuMo) metallurgy, and is formed using a powdered Metal-Injection-Molding process. Preferably, the base 22 is gold plated with an electrolytic nickel under plating. Alternatively, the base 22 may be made of copper-tungsten (CuW) metallurgy. Regardless of what material the base 22 is made, it is preferred that the base 22 is formed of a material which is compatible with the integrated circuit 30. Specifically, it is preferred that the base 22 have a coefficient of thermal expansion (CTE) that is compatible to that of the integrated circuit 30 since, as mentioned, the integrated circuit 30 is mounted on the base 22. In other words, it is preferred that the base 22 and integrated circuit 30 be substantially thermally matched.

Figure 4:
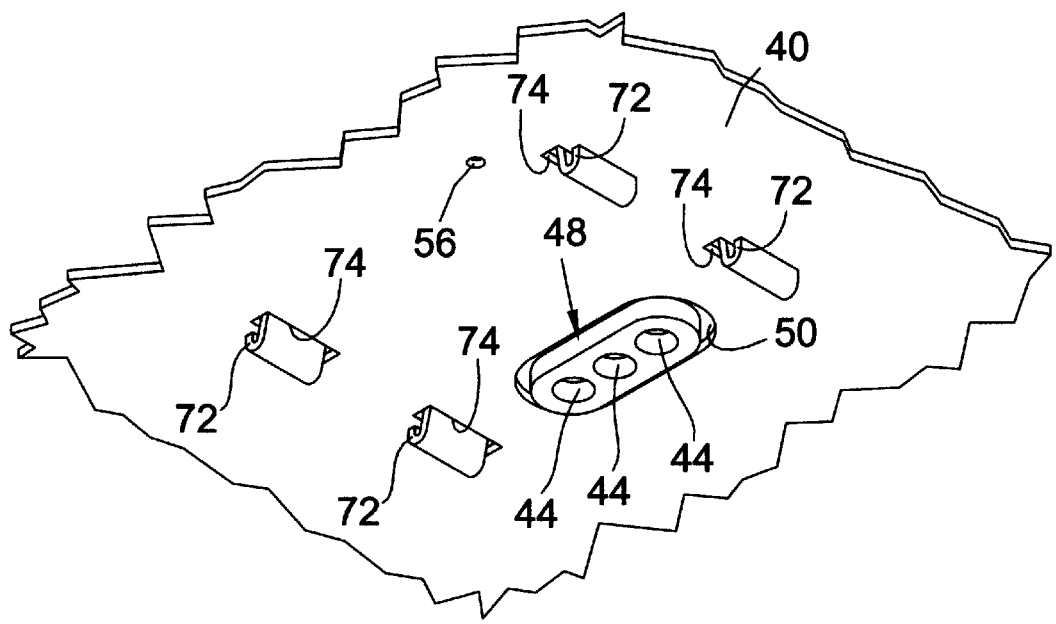
FIG. 4 is a perspective view, similar to that of FIG. 3, of the mounted packaged integrated circuit, with the view taken from a bottom side of a support plate.
Figure 6:
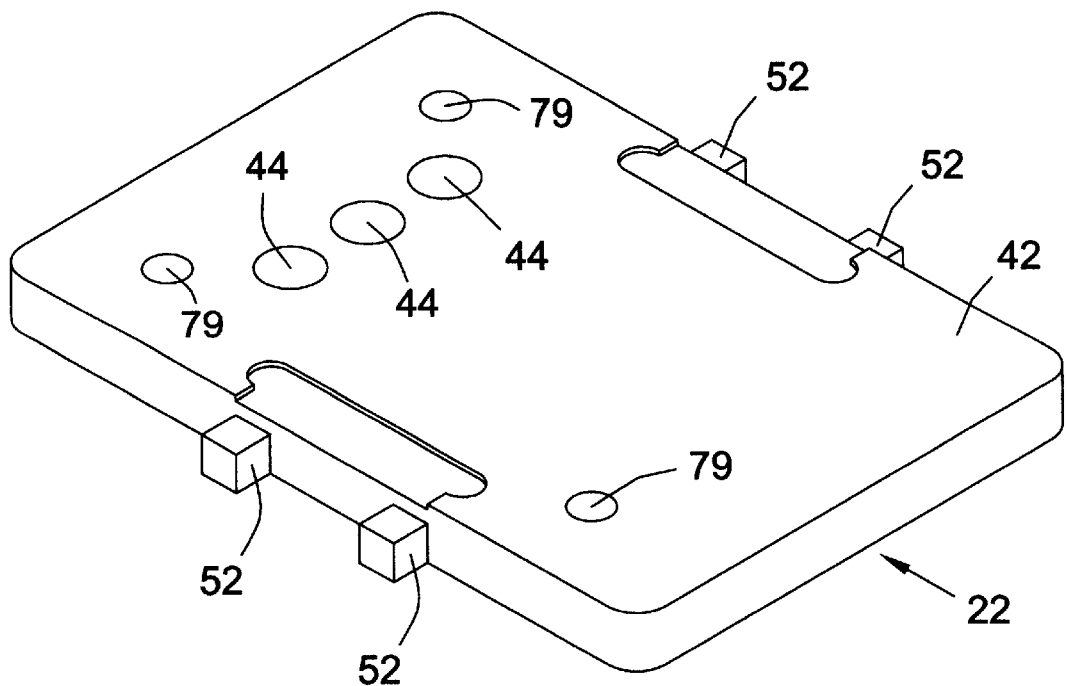
FIG. 6 is a perspective view of a top of a base component of the packaged integrated circuit illustrated in FIG. 1.
Figure 7:
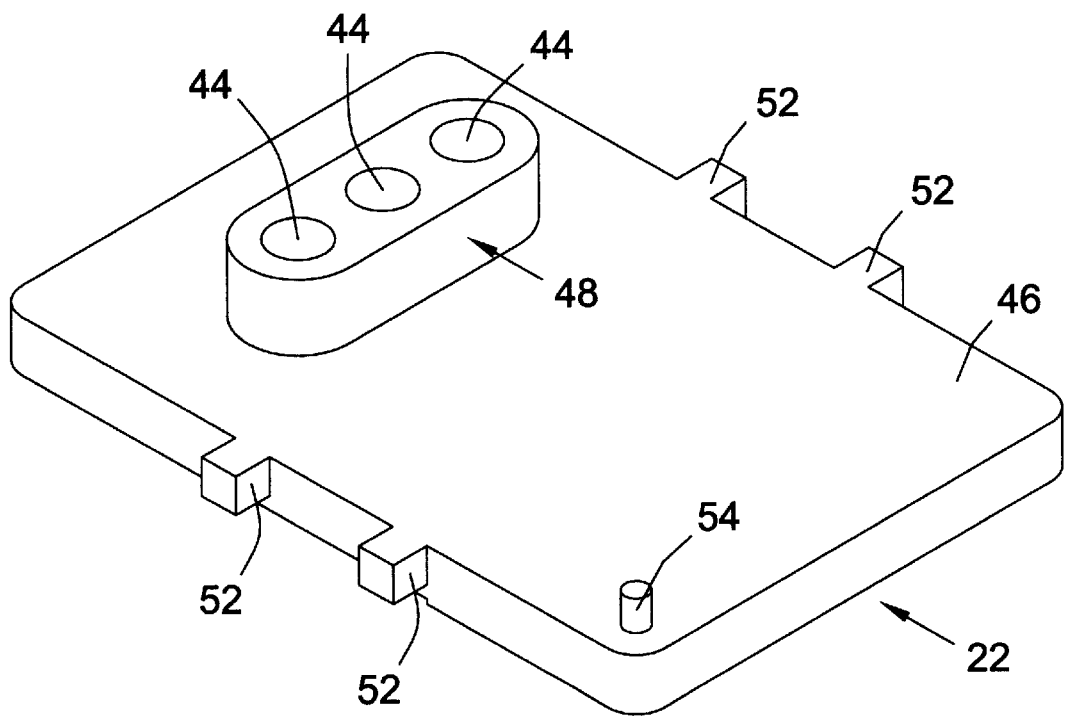
FIG. 7 is a perspective view of a bottom of the base component of the packaged integrated circuit illustrated in FIG. 1.

As shown in FIG. 6, the base 22 includes a substantially flat top surface 42, and has a plurality of waveguide ports 44 extending through the base 22 from the top surface 42 to a bottom surface 46 of the base 22 (see FIG. 7). The waveguide ports 44 are essentially throughbores extending from the top surface through a chimney structure 48 on the bottom surface 46 of the base 22. The chimney structure 48 defines a protrusion which, as shown in FIG. 4, is preferably received in an opening 50 in the support plate 40 (and possibly also in an opening in the printed wiring board 36 in the case where the package 20 is mounted directly on the printed wiring board 36) such that the chimney structure 48 extends to the opposite side of the support plate 40. In the case where the package 20 is mounted directly on the support plate 40, as shown in FIG. 3, the chimney structure 48 need not be provided as protruding as great of a distance from the bottom surface 46 of the base 22 to provide that the chimney structure 48 extends to the other side of the support plate 40 through the aperture 50 therein. In contrast, if the package 20 is configured to be mounted directly onto the surface of the printed wiring board 36, the chimney structure 48 will need to protrude a greater distance from the bottom surface 46 of the base 22 to provide that the chimney structure 48 extends to the other side of the support plate 40 through the aperture 50 in the support plate 40 and a respective aperture in the printed wiring board 40.

Preferably, the waveguide ports 44 are electrically connected to the millimeter wave circuit 32 on the glass substrate 34 (the integrated circuit 30) which is mounted onto the top surface 42 of the package base 22, as illustrated in FIG. 5. The base 22 acts as a heat sink for the integrated circuit 30. The waveguide ports 44 both receive and transmit energy to and from the millimeter wave integrated circuit 32 to and from the exterior of the package 20. Preferably, the waveguide ports 44 of the package 20 are co-located within an antenna structure thus providing the transmitter and receiver functionality. The waveguide ports 44, which are preferably part of the base 22 of the package 20, enhance the heat dissipation capabilities of the package 20.

As shown in FIGS. 6 and 7, positioning structures 52, such as bosses, are located on a perimeter of the base 22. Specifically, there may be two bosses provided on opposite sides of the base 22. As shown in FIG. 3, the positioning structures 52 position and align the spring clip 28 with respect to the interconnects 26 of the package 20 such that the spring clip 28 presses the interconnects 26 into contact with the printed wiring board 36 as illustrated in FIG. 3. As mentioned, preferably the spring clip 28 presses the interconnects 26 into electrical contact with conductive traces 38 on the printed wiring board 36. Additionally, as depicted in FIG. 7, it is preferred that one or more locating structures 54, such as a locating boss, be provided on the bottom surface 46 of the base 22 for positioning the package 22. To this end, each locating structure 54 is received in an aperture 56 (shown in FIG. 4) in the support plate 40 in the case where the package 20 is mounted directly onto the support plate 40 as shown in FIG. 3. In the case where the package 20 is mounted directly on the surface of the printed wiring board 36, each locating structure 54 would also be received in a respective aperture in the printed wiring board 36, or possibly only in an aperture in the printed wiring board 36 and not in an aperture in the support plate 40.

As shown in FIG. 5, the interconnects 26 are provided on the base 22 adjacent the positioning structures 52 on the perimeter of the base 22. As such, the interconnects 26 are preferably provided on opposite sides of the base 22. The interconnects 26 may be epoxied to the top surface 42 of base 22, and each is electrically connected, such as by wire bonds, to the integrated circuit 30 which is mounted on the top surface 42 of the base 22. Because the integrated circuit 30 is electrically connected to the interconnects 26, the electrical connections between the interconnects 26 and the conductive traces 38 on the printed wiring board 36 or other substrate which result when the package 20 is mounted provide that the integrated circuit 30 within the package is electrically connected to the conductive traces 38.

The preferred structure of the interconnects 26 will now be described with reference to FIG. 8. Each interconnect 26 is preferably a metalized polyimide film formed of multiple layers 58, 60, 62. Specifically, a conducting transmission layer 58 is disposed between two insulating layers 60, 62. A base insulating layer 60 is preferably a polyimide dielectric having a thickness in the range of 20 to 45 microns. The conducting layer 58 is preferably copper with a thickness of 20 to 45 microns, and is laminated or otherwise adhered to the base layer 60. The conducting layer 58 preferably comprises patterned conductive traces 59 that may be formed of copper. The top insulating layer 62 is preferably a polyimide dielectric having a thickness between 20 and 45 microns, and is laminated or otherwise adhered to the base and conducting layers, 60 and 58.

As mentioned, and as shown in FIG. 3, the spring clip 28 presses the interconnects 26 into contact with the printed wiring board 36 or other substrate when the package 20 is mounted with respect thereto. Specifically, the conducting layer 58 of each interconnect 26 contacts the printed wiring board 36, and preferably electrically connects with conductive traces 36 thereon. Therefore, because the interconnects 26 are electrically connected to the integrated circuit 30 within the package 20, the conductive traces 38 on the printed wiring board 36 or other substrate become electrically connected to the integrated circuit 30 via the interconnects 26 of the package 20.

As mentioned, and as shown in FIGS. 1 and 3, a cover 24 is engaged with the base to form a housing. Specifically, the cover 24 is preferably epoxied to the base 22 to form the housing. The cover 24 is preferably formed of a NiFe alloy, and is formed using a powdered Metal-Injection-Molding process. Preferably, the cover 24 is gold plated with an electrolytic nickel under plating. Regardless of what material the cover 24 is made, it is preferred that the cover 24 be formed of a material which is compatible with the base 22. It is preferred that the base 22 and the cover 24 be somewhat thermally matched, having comparable coefficients of thermal expansion (CTE). As shown in FIGS. 1 and 5, preferably the integrated circuit 30 includes a dielectric resonator 64, such as a DR puck, which is epoxied to the integrated circuit 30, and, as shown in FIG. 5, the cover 24 includes a wall 66 which defines a shield region 68 for the dielectric resonator 64 when the cover 24 is contacted with the base 22. Of course, other embodiments may not include a dielectric resonator 64.

The spring clip 28 secures the package 20 with respect to the printed wiring board 36 by engaging with the printed wiring board 36, or, as shown, by engaging directly with the support plate 40. The spring clip 28 will now be described. As shown in FIGS. 1 and 2, the spring clip 28 includes a plurality of legs 70 each having a lip 72 thereon. As shown in FIGS. 3 and 4, when the package 20 is mounted, the legs 70 of the spring clip 28 are preferably received in apertures 74 in the support plate 40, as shown in FIGS. 3 and 4, such that the lips 72 of the legs 70 engage against the support plate 40, as shown in FIG. 4, to secure the package 20 in place with respect to the printed wiring board 36. In the case where the package 20 is mounted directly on the surface of the printed wiring board 36 rather than on the support plate 40, the legs 70 of the spring clip 28 would be received in apertures in both the support plate and printed wiring board. Regardless, as shown, the spring clip also includes two outwardly extending portions 76 which press the interconnects 26 into engagement with the printed wiring board 36, as shown in FIG. 3, and preferably into electrical contact with conductive traces 38 thereon. It is preferred that each outwardly extending portion 76 includes a plurality of pressure contact members 78 such as fingers. Assembly of the package 20 will now be described. First, the interconnects 26 are installed on the base 22. This can be performed using a hot-bar B-stage epoxy attachment process as one having ordinary skill in the art would recognize. Then, a dark color epoxy ink is deposited in fiducial recesses 79 in the base 22 for optical alignment contrast in assembly. Next, a low modulus conductive epoxy is applied to the top surface 42 of the base 22 using a screen printing process or a pad printing process as one having ordinary skill in the art would recognize. Preferably, the epoxy is applied in a preferred pattern in the area where the integrated circuit 30 is to be attached on the base 22. Then, the integrated circuit 30 is positioned on the top surface 42 of the base 22, and the low modulus conductive epoxy is cured. Then, the semiconductor die are attached to the integrated circuit 30 and the interconnects 26 are connected to the integrated circuit 30 using a thermosonic wire bonding or flip chip attachment process. Next, if a dielectric resonator 64, such as a DR puck, is to be provided on the integrated circuit 30, epoxy is deposited on the integrated circuit 30 in the position in which the dielectric resonator 64 is desired. Then, the dielectric resonator 64 is placed on the epoxy, and the epoxy is cured. Next, an epoxy seal ring is applied to a seal edge of the cover 24, the cover 24 is attached to the base 22, and the epoxy seal ring is cured. Subsequently, the package 20 is preferably subjected to electrical testing before the package 20 is mounted on a printed wiring board 36 or other substrate as shown in FIG. 3.

Mounting of the package 20 onto a substrate will now be described. Specifically, mounting of the assembled package 20 onto a printed wiring board 36 by engaging the package 20 directly with a support plate 40 will be described, where the printed wiring board 36 is provided with a cut-out or relief 41 at a location at which the package 20 will be mounted directly onto the support plate 40. However, one having ordinary skill in the art would recognize that it is readily possible to configure the package for mounting directly onto the surface of a printed wiring board 36 where there is no relief in the printed wiring board. In this case, apertures would be provided in the printed wiring board for receiving the legs 70 of the spring clip 28 as well as the chimney structure 48 and each locating structure 54 provided on the bottom surface 46 of the package 20. As discussed, and as shown in FIG. 3, in the case where the package 20 is mounted directly on the support plate 40, the printed wiring board 36 includes an opening 41 that allows the package 20 to be seated against the support plate 40. Additionally, as shown in FIG. 4, openings 56, 74 are provided in the support plate 40 for receiving each locating structure 54 and chimney structure 48 that are featured on the bottom surface 46 of the package 20, as well as for receiving the legs 70 of the spring clip 28 such that when the legs 70 of the spring clip 28 are received, the lips 72 on the legs 70 of the spring clip 28 engage against the support plate 40 thereby locking the package 20 in place. When the package 20 is locked in place, the outwardly extending portions 76 of the spring clip 28 press the interconnects 26 of the package 20 into contact with the printed wiring board 36 as shown in FIG. 3. As mentioned, preferably the conducting layer 58 of each interconnect 26 is pressed into electrical connection with conductive traces 38 on the printed wiring board 36 thereby providing that the conductive traces 38 are electrically connected to the integrated circuit 30 via the interconnects 26 of the package 20.

As shown in FIG. 4, when the package 20 is mounted, preferably the chimney structure 48, which are the waveguide ports 44 of the base 22, extends through an aperture 50 in the support plate 40. This provides that RF energy such as microwave energy can be removed and applied in an efficient manner through the respective circuit features of the millimeter wave integrated circuit 32 which are received in the waveguide ports 44.

Regardless of whether the package 20 is configured for mounting on a printed wiring board 36 or directly on a support plate 40, it is preferred that the package 20 becomes mounted with respect to a printed wiring board 36 or other substrate such that the interconnects 26 of the package 20 become electrically connected to conductors thereon, and the waveguide ports 44 extend to the opposite side.

The packages 20a, 20b which are depicted in FIG. 9 and 13 and which are in accordance with alternative embodiments of the present invention will now be described. Because the packages 20a, 20b depicted in FIGS. 9 and 13 have components which are similar to those of package 20, similar reference numerals will be used with an alphabetic suffix to identify similar parts, and a detailed description thereof is omitted at times with the understanding that one may review the description of package 20 to obtain an understanding thereof. Specifically, the suffix "a" will be used in association with the package 20a illustrated in FIG. 9, and the suffix "b" will be used in association with the package illustrated in FIG. 13.

Figure 11:
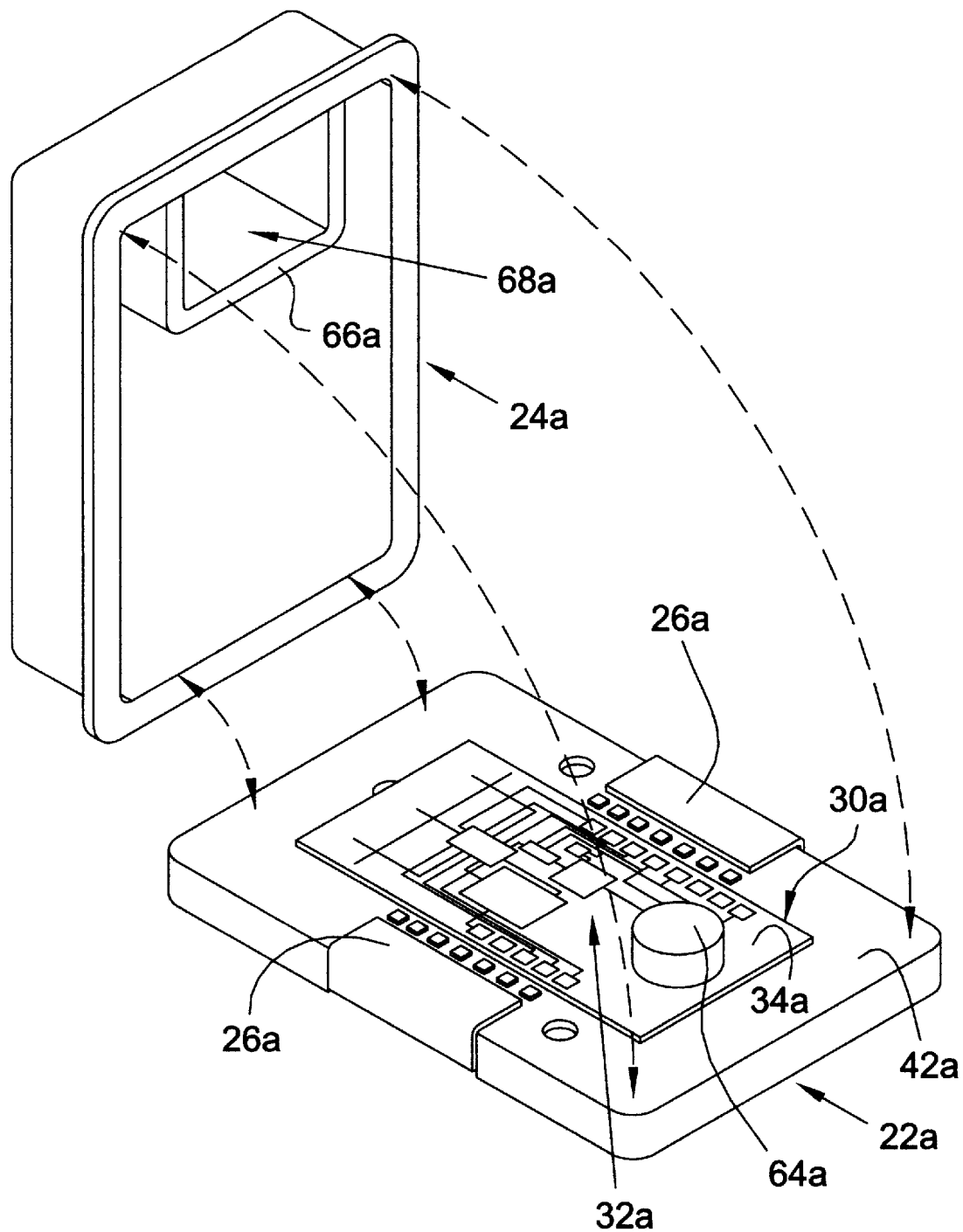
FIG. 11 is a perspective view of the packaged integrated circuit illustrated in FIG. 9, showing a spring clip removed and a cover flipped from a base thereby exposing internal components of the packaged integrated circuit.
Figure 12:
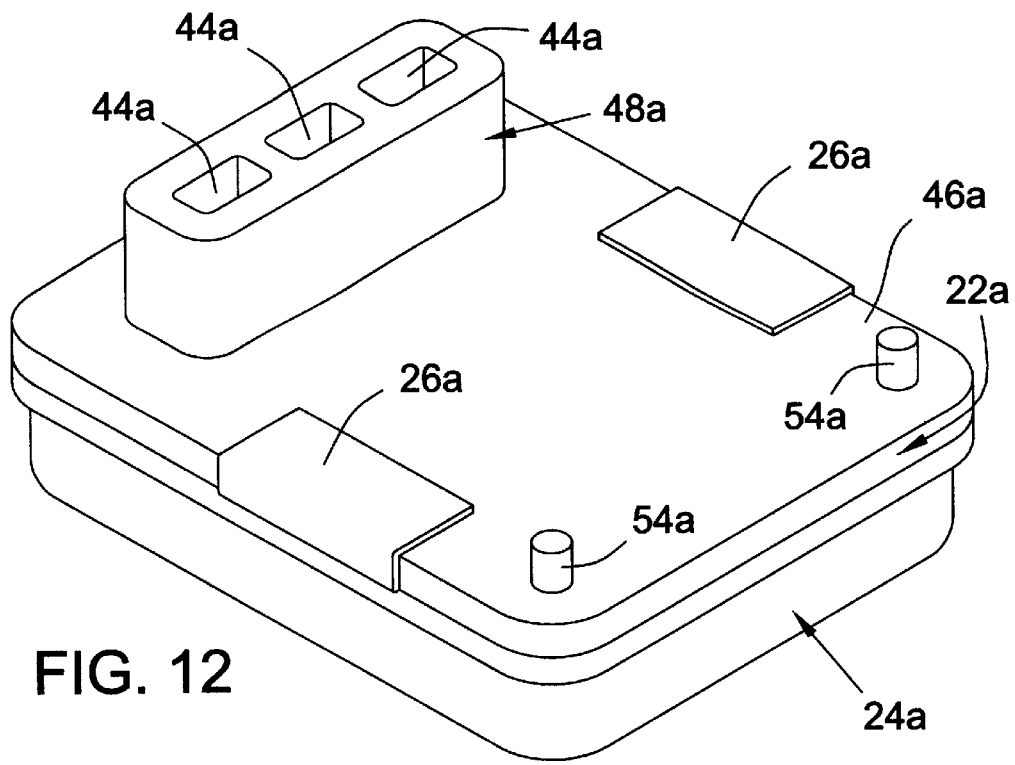
FIG. 12 is a perspective view of a bottom of the packaged integrated circuit illustrated in FIG. 9.

The package 20a illustrated in FIG. 9 will now be described, and FIGS. 9–13, as well as FIG. 8, relate thereto. As shown in FIG. 9, package 20a, like package 20, also includes a base 22a and a cover 24a adhered to the base 22a to form a housing. As shown in FIG. 12, the bottom surface 46a of the base 22a includes a chimney structure 48a which has three waveguide ports 44a formed therein for receiving waveguides of an integrated circuit 30a. As shown in FIG. 11, the integrated circuit 30a is mounted on a top surface 42a of the base 22a, and preferably includes a dielectric resonator 64a such as a DR puck which is shielded by a region 68a defined by a wall 66a of the cover 24a when the cover 24a is contacted with the base 22a. As with the package 20 shown in FIG. 1, preferably the integrated circuit 30a mounted in package 20a on the base 22a thereof is a millimeter wave circuit 32a mounted on a glass substrate 34a.

Essentially, the main difference between the package 20a depicted in FIG. 9 and the package 20 depicted in FIG. 1, and already described, is that interconnects 26a of the package 20a illustrated in FIG. 9 wrap around the edges of the base 22a to the bottom surface 46a of the base 22a rather than outwardly extend from a perimeter of the base 22a. This can best be viewed in FIG. 11. As a result, the spring clip 28a which is used to mount the package 20a, does not include outwardly extending portions for contactably pressing the interconnects 26a into contact with conductive traces 38 when the package is mounted. Similar to the package 20 shown in FIG. 1, the package 20a preferably provides, as shown in FIG. 10, that the chimney structure 48a on the base 22a of the package 20a extends to the other side of a support plate 40.

The package 20a depicted in FIG. 9 is configured for mounting onto the surface of a printed wiring board 36. However, one having ordinary skill in the art would recognize that the package 20a can also be configured for mounting directly onto a support plate 40, in a relieved area of the printed wiring board 36.

Figure 10:
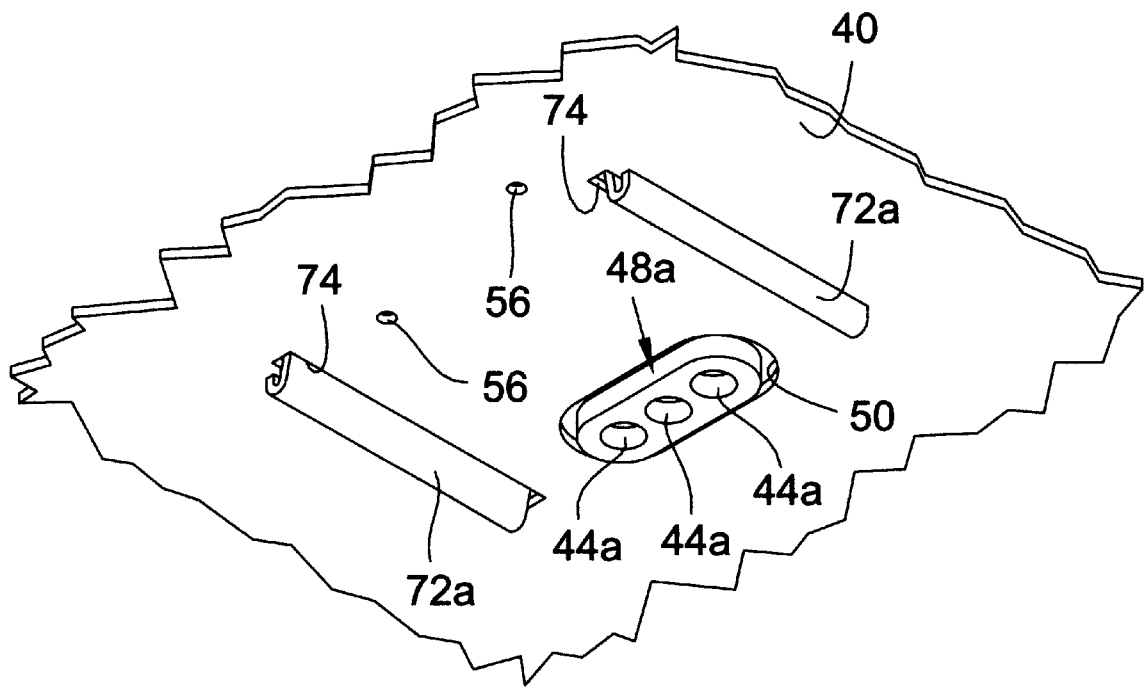
FIG. 10 is a perspective view, similar to that of FIG. 9, of the mounted packaged integrated circuit, with the view taken from a bottom side of a support plate.

As shown in FIGS. 9 and 10, when the package 20a is mounted, the chimney structure 48a is received by an aperture 50 in the support plate 40 and printed wiring board 36 (in the case where the package 20a is mounted directly onto the surface of the support plate 40, the chimney structure 48a is received only in an aperture in the support plate 40) to position the package 20a with respect to the printed wiring board 36, as shown in FIG. 1. As shown in FIG. 9, when the package 20a is mounted, legs 70a of the spring clip 28a are received in apertures 80 in the printed wiring board 36 (only one shown), and corresponding apertures 74 in the support plate 40 (see FIG. 10) (in the case where the package 20a is mounted directly onto the surface of the support plate 40, the legs 72a would only be received by apertures in the support plate 40).

Additionally, as shown in FIG. 12, locating bosses 54a are preferably provided on the bottom surface 46a of the base 22a of the package 20a, and the locating bosses 54a are preferably received in apertures 56 in the printed wiring board 36 and support plate 40 (see FIG. 10) to position the package 20a with respect to the printed wiring board 36, as shown in FIG. 9. Preferably, the components of the package 20a illustrated in FIG. 9 are formed of the same materials as corresponding components of the package 20 illustrated in FIG. 1. For example, preferably the interconnects 26a of package 20a are formed of the same materials as the interconnects 26 of package 20.

As shown in FIG. 13, package 20b also includes a base 22b and a cover 24b adhered thereto to form a housing. As shown in FIG. 15, the bottom surface of the base includes two waveguide structures 48b thereon which have waveguide ports 44b disposed therein. These waveguide structures 48b can have one or more waveguide ports 44b to facilitate the desired functionality of the enclosed integrated circuit 30b (see FIG. 14). As with the packages 20, 20a previously described, an integrated circuit 30b is mounted on the base and the integrated circuit 30b preferably is a millimeter wave circuit 32b mounted on a glass substrate 34b.

Figure 14:
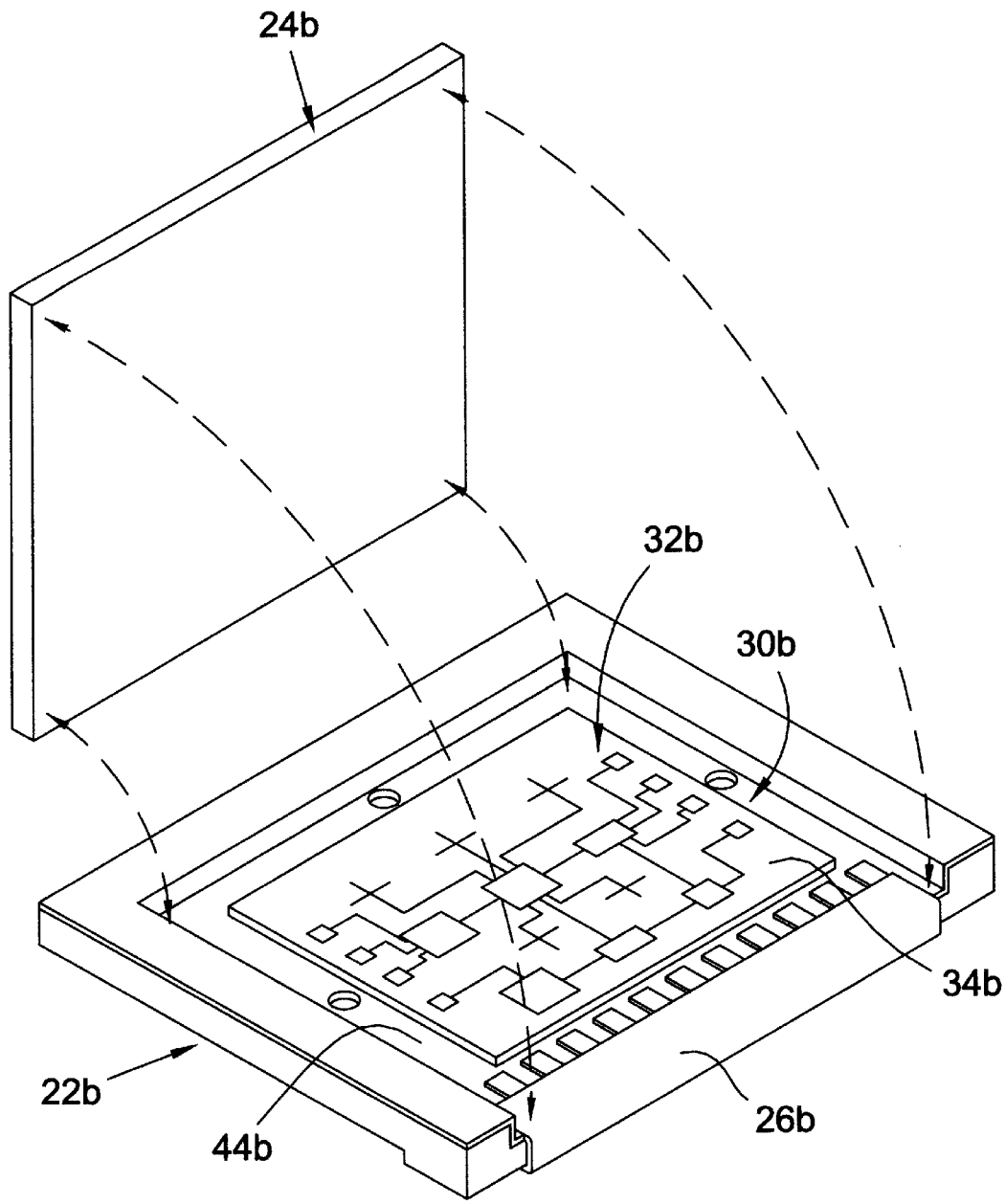
FIG. 14 is a perspective view of the packaged integrated circuit illustrated in FIG. 13, showing a spring clip removed and a cover flipped from a base thereby exposing internal components of the packaged integrated circuit.
Figure 15:
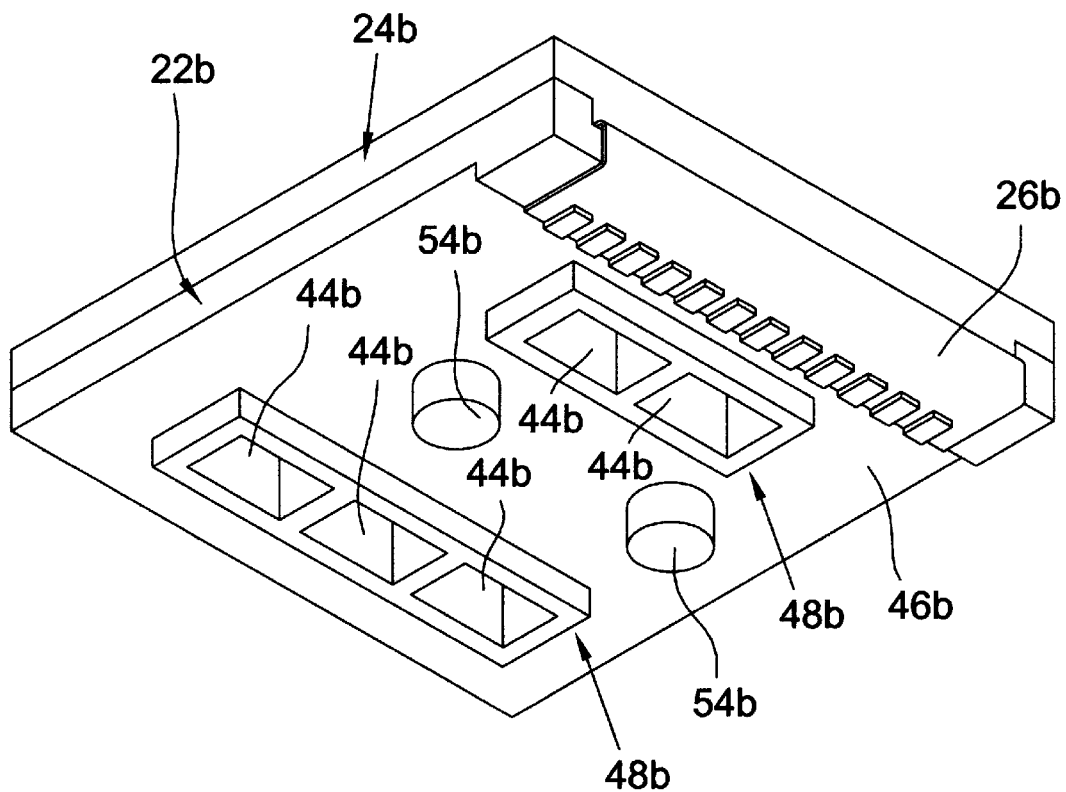
FIG. 15 is a perspective view of a bottom of the packaged integrated circuit illustrated in FIG. 13.

As shown in FIG. 14, the package 20b includes a single interconnect 26b which, like those of package 20a depicted in FIG. 9, wraps around the edge of the base 22b to the bottom surface 46b thereof. Hence, if a spring clip (not shown) is used with package 20b to mount the package 20b to a printed wiring board 36 or other substrate, the spring clip would need not include outwardly extending portions for contactably pressing the interconnects into contact with conductive traces when the package is mounted.

Similar to the packages 20, 20a previously described, the package 20b preferably provides that the waveguide structures 48b are received in apertures in a support plate (if provided) as well as in apertures in the printed wiring board 36 in the case where the package 20b is mounted directly thereon, as shown in FIG. 13, thereby providing the desired positioning of the package 20b and providing that the waveguide structures 48b extend to the other side. As discussed, in the case where the package 20b is to be mounted directly on a support plate, the waveguide structures 48b would need not be provided as protruding as far from the bottom surface 46b of the package 20b to provide that the waveguide structure 48b will extend to the other side of the printed wiring board and/or support plate.

As with the other packages described, locating bosses 54b are preferably provided on the bottom surface 46b of the base 22b of the package 20b as shown in FIG. 15, and the locating bosses 54b are received in corresponding apertures to position the package 20b when the package 20b is mounted. Preferably, the components of the package 20b illustrated in FIGS. 12–15 are formed of the same materials as corresponding components of the packages 20, 20a previously described. For example, preferably the interconnect 26b is formed of the same materials as interconnects 26 and 26a.

With regard to assembling and mounting the packages 20a and 20b, illustrated in FIGS. 9 and 13, essentially the same assembly and mounting processes can be employed as described in relation to the package 20 illustrated on FIG. 1.

As mentioned, a package in accordance with the present invention may be configured for mounting on the surface of a printed wiring board, directly on a support plate or essentially any other substrate without departing from the scope of the present invention.

While specific embodiments of the present invention are shown and described, it is envisioned that those skilled in the art may devise various modifications of the present invention without departing from the spirit and the scope of the appended claims.

What is claimed is:

1. A packaged integrated circuit comprising:
   an integrated circuit;
   a base which is mountable with respect to a substrate, said base having said integrated circuit disposed thereon and including at least one waveguide bore, said waveguide bore being positioned for alignment with a corresponding aperture in said substrate, said base having at least one interconnect thereon which is electrically connected to said integrated circuit; and
   a cover disposed on said base to form a housing for said integrated circuit, said interconnect extending from an interior cavity of said housing to an exterior of said housing.

2. A packaged integrated circuit as recited in claim 1, further comprising at least one protrusion on said base aligned with said waveguide bore for insertion in said aperture when said base is mounted with respect to said substrate.

3. A packaged integrated circuit as recited in claim 2, wherein said protrusion is unitary with said base and comprises at least a portion of said waveguide bore.

4. A packaged integrated circuit as recited in claim 2, wherein said protrusion includes one or more of said waveguide bores.

5. A packaged integrated circuit as recited in claim 1, wherein the integrated circuit comprises a millimeter wave circuit disposed on a glass substrate.

6. A packaged integrated circuit as recited in claim 1, wherein said interconnect comprises a polyimide connector configured for electrically connecting the integrated circuit to conductive traces on said substrate when said base is mounted with respect thereto.

7. A packaged integrated circuit as recited in claim 6, wherein said polyimide connector comprises a polyimide dielectric insulating layer on each side of a conducting layer, said conducting layer comprising a plurality of conductive traces.

8. A packaged integrated circuit as recited in claim 6, wherein said polyimide connector is adhered to an edge of said base.

9. A packaged integrated circuit as recited in claim 6, further comprising a pair of polyimide connectors adhered to opposite edges of said base.

10. A packaged integrated circuit as recited in claim 1, wherein said waveguide bore is configured for insertion in an aperture in a plate supporting said substrate when said base in mounted with respect to said substrate.

11. A packaged integrated circuit as recited in claim 1, wherein said integrated circuit includes a dielectric resonator.

12. A packaged integrated circuit as recited in claim 11, wherein said cover includes at least one wall defining a shield region when said cover is contacted with said base.

13. A packaged integrated circuit as recited in claim 1, further comprising a pressure clip engageable with at least one of said substrate and a plate supporting said substrate and engageable with said cover hereby mounting said packaged integrated circuit.

14. A packaged integrated circuit as recited in claim 13, wherein said pressure clip and said interconnect are configured such that said pressure clip contacts said interconnect and presses said interconnect into electrical connection with said substrate when said packaged integrated circuit is mounted.

15. A packaged integrated circuit as recited in claim 14, wherein said base includes at least one positioning structure for positioning said pressure clip with respect to said interconnect.

16. A packaged integrated circuit as recited in claim 1, wherein said cover and said base are comprised of metal.

17. A packaged integrated circuit as recited in claim 1, wherein said cover and said base are comprised of a powdered metal.

18. A packaged integrated circuit as recited in claim 1, wherein said base includes at least one boss thereon for positioning said packaged integrated circuit when said packaged integrated circuit is mounted.

19. A packaged integrated circuit comprising:
    a millimeter wave circuit including a dielectric resonator;
    a base which is mountable with respect to a substrate, said base having said millimeter wave circuit thereon, said base including at least one waveguide bore and having a plurality of interconnects which are electrically connected to said millimeter wave circuit and are electrically connectable to said substrate when said base is mounted, said waveguide bore being configured to align with an aperture in at least one of said substrate and a plate supporting said substrate when said base is mounted, wherein each of said interconnects is disposed on an edge of said base and includes a conducting layer disposed between polyimide insulating layers; and
    a cover in contact with said base, said cover including at least one wall defining a region for shielding said dielectric resonator.

\* \* \* \* \*